(12) United States Patent
Wang et al.

(10) Patent No.: US 8,718,587 B2
(45) Date of Patent: May 6, 2014

(54) RECONFIGURABLE LNA FOR INCREASED JAMMER REJECTION

(75) Inventors: Cheng-Han Wang, San Jose, CA (US); Liang Zhao, Sunnyvale, CA (US); Hong Sun Kim, San Jose, CA (US); Jin-Su Ko, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 9 days.

(21) Appl. No.: 13/450,120

(22) Filed: Apr. 18, 2012

(65) Prior Publication Data

US 2013/0281042 A1 Oct. 24, 2013

(51) Int. Cl.
*H04B 1/06* (2006.01)

(52) U.S. Cl.
USPC ............. 455/278.1; 455/63.1; 455/296

(58) Field of Classification Search
USPC ............. 455/278.1, 63.1, 293, 260, 78, 73; 330/136
See application file for complete search history.

(56) References Cited

U.S. PATENT DOCUMENTS

| | | | |
|---|---|---|---|
| 6,323,806 B1 * | 11/2001 | Greving | 342/372 |
| 6,704,557 B1 * | 3/2004 | Krishnamurthy et al. | 455/278.1 |
| 6,779,752 B1 * | 8/2004 | Ratkovic | 244/3.15 |
| 8,010,055 B2 | 8/2011 | Buer | |
| 8,102,213 B2 | 1/2012 | Tasic et al. | |
| 2002/0123319 A1 * | 9/2002 | Peterzell | 455/296 |
| 2002/0132597 A1 * | 9/2002 | Peterzell et al. | 455/130 |
| 2005/0261797 A1 | 11/2005 | Cyr et al. | |
| 2006/0160510 A1 | 7/2006 | Seppinen et al. | |
| 2007/0042725 A1 | 2/2007 | Poilasne et al. | |
| 2007/0103248 A1 * | 5/2007 | Nakamura et al. | 331/167 |
| 2007/0262817 A1 | 11/2007 | Ciccarelli et al. | |
| 2009/0258624 A1 | 10/2009 | Gudem et al. | |
| 2010/0026547 A1 | 2/2010 | Weissman et al. | |
| 2011/0021168 A1 | 1/2011 | Weissman et al. | |
| 2011/0205114 A1 * | 8/2011 | Landmark et al. | 342/357.73 |
| 2013/0078937 A1 * | 3/2013 | Leverich | 455/232.1 |

OTHER PUBLICATIONS

International Search Report and Written Opinion—PCT/US2013/037241—ISA/EPO—Dec. 11, 2013.
Ranjan M., et al., "A Low-Cost and Low-Power CMOS Receiver Front-End for MB-OFDM Ultra-Wideband Systems", IEEE Journal of Solid-State Circuits, Service Center, Piscataway, NJ, USA, vol. 42, No. 3, Mar. 1, 2007, pp. 592-601, XP011171996, ISSN: 0018-9200, DOI: 10.1109/JSSC. 2006.891725 p. 592, left-hand column, line 29-p. 596, right-hand column, line 25; figures 3(a), 9, 10.

* cited by examiner

*Primary Examiner* — Creighton Smith
(74) *Attorney, Agent, or Firm* — Ramin Mobarhan (57) ABSTRACT

A reconfigurable LNA for increased jammer rejection is disclosed. An exemplary embodiment includes an LNA having a tunable resonant frequency, and a detector configured to output a control signal to tune the resonant frequency of the LNA to increase jammer suppression. An exemplary method includes detecting if a jammer is present, tuning a resonant frequency of an LNA away from the jammer to increase jammer rejection if the jammer is present, and tuning the resonant frequency of the LNA to a selected operating frequency if the jammer is not present.

20 Claims, 5 Drawing Sheets

RECONFIGURABLE LNA FOR INCREASED JAMMER REJECTION

BACKGROUND

1. Field

The present application relates generally to the operation and design of wireless devices, and more particularly, to the operation and design of low noise amplifiers.

2. Background

High quality signal reception is especially important for the current generation of portable devices. Typically, such devices provide multiple services, such as wireless communication services and, for example, position location services that require the reception of global navigation satellite signals. For example, global navigation satellite systems comprise a wide range of satellite positioning systems (SPS) that include the Global Positioning System (GPS) used in the United States, the GLObal Navigation Satellite System (GLONASS) used in Russia, the COMPASS navigation system used in China, the Galileo system used in Europe, and other regional positioning systems. Thus, the front end of a wireless receiver needs to be carefully designed to reject interfering signals and receive desired signals with high sensitivity.

To illustrate the problem, consider a GPS coexistence scenario where a portable device includes a GPS receiver and a cellular transmitter. In this GPS coexistence scenario, strong radio frequency signals can appear at the GPS receiver's front-end due to transmission on the cellular channel. Such signals may jam the GPS receiver and thus interfere with GPS signal reception. To address this problem, GPS receiver designs usually provide high linearity and have a very low noise figure (NF). Providing this high level of performance also result in high power consumption. For example, to operate concurrently during strong Tx jammer power and to avoid GPS local oscillator (LO) phase noise being mixed down to the IF Band through reciprocal mixing, the GPS LO should have very low phase noise, which may result in excessive power consumption.

Therefore, what is needed is a way to relax the LO requirements for low phase noise when strong Tx Jammer power is present in a front end receiver. It is therefore desirable to have a front end receiver with improved jammer suppression so that the LO requirements can be relaxed.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
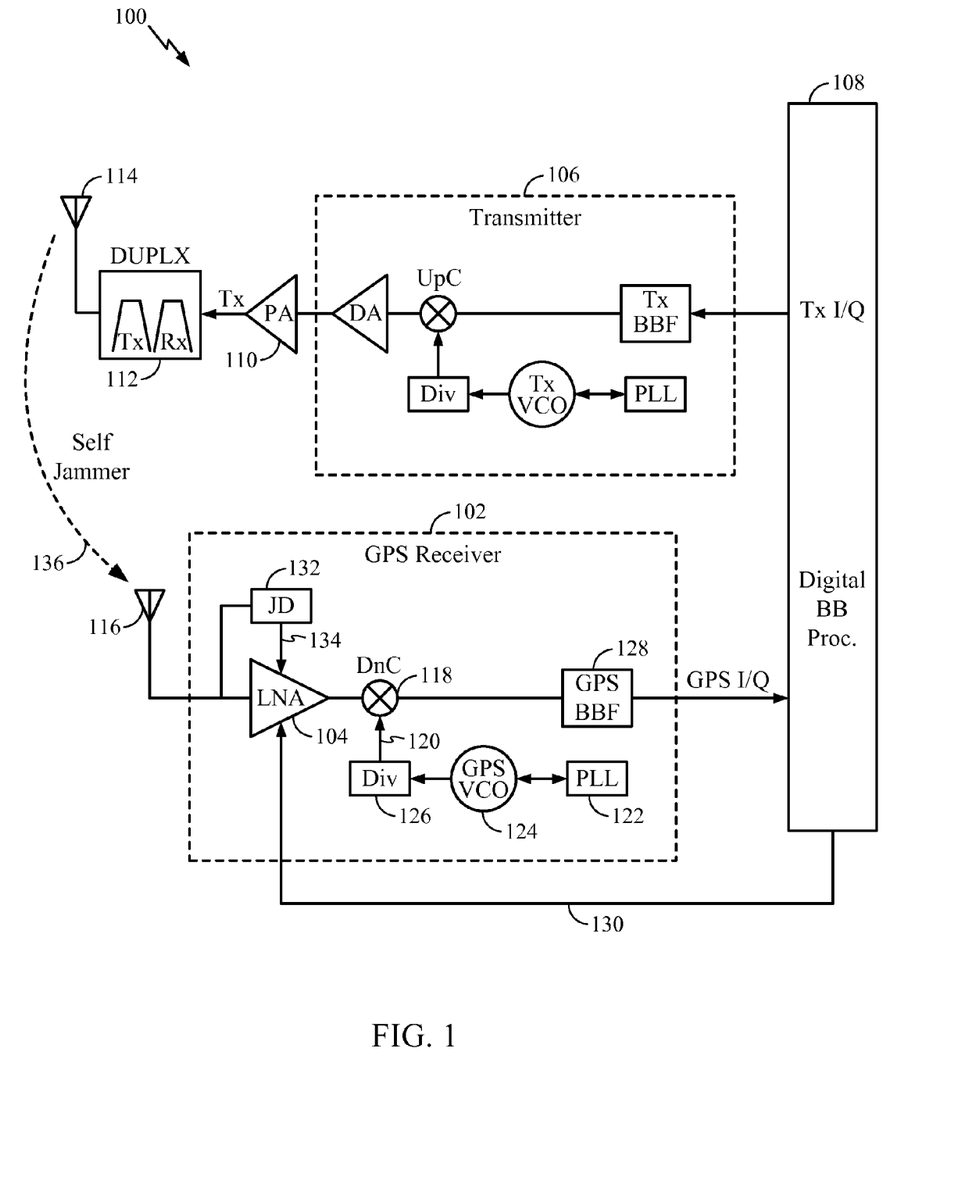
FIG. 1 shows an exemplary embodiment of a front end comprising a GPS receiver that includes a reconfigurable LNA.

FIG. 1 shows an exemplary embodiment of a front end 100 comprising a GPS receiver 102 that includes a reconfigurable LNA 104. For example, the front end 100 is suitable for use in a wireless device to provide communication and geographic positioning services. It should be noted that the GPS receiver 102 may also comprises any suitable Global Navigation Satellite Systems (GNSS) receiver.

The front end 100 comprises a transmitter 106 configured to transmit data from a digital baseband processor 108. The output of the transmitter 106 is coupled to a power amplifier 110 that generates a transmit signal that is input to a duplexer 112. The output of the duplexer 112 flows to an antenna 114 for transmission.

The GPS receiver 102 receives low-level GPS signals and noise at antenna 116 and these signals are input to the reconfigurable LNA 104. As described in greater detail below, exemplary embodiments of the LNA 104 are reconfigurable so that its resonant frequency can be adjusted to provide increased jammer suppression. In addition to providing increased jammer suppression, the LNA 104 amplifies the received signals and passes the amplified signals to a downconverter 118 that downconverts the GPS signals to baseband by utilizing a local oscillator (LO) signal 120 generated by phase lock loop (PLL) 122, voltage controlled oscillator 124, and frequency divider 126. The downconverted GPS signals are passed through a baseband filter 128 and then fed into the digital base band processor 108 that processes the filtered GPS signals to determine position information.

During operation, the digital baseband processor 108 is aware of transmissions from the transmitter 106 and the associated transmission frequency. Transmitted power from the transmitter 106 may feedback into the GPS receiver 102 through the antenna 116 (as a self jammer illustrated at 136) to degrade GPS performance. In an exemplary embodiment, the digital baseband processor 108 outputs a control signal 130 that is input to the reconfigurable LNA 104. The control signal 130 adjusts the LNA 104 to cause the resonant frequency of the LNA 104 to be shifted in frequency away from the frequency of the self jamming signal. Shifting the resonant frequency of the LNA 104 operates to increase jammer suppression.

In another exemplary embodiment, the digital baseband processor 108 is operable to detect external jammers that may affect the performance of the GPS receiver 102. For example, the digital baseband processor 108 may receive information about external jammers from other receivers (not shown) in a wireless device. When an external jammer is detected, the digital baseband processor 108 outputs the control signal 130 to adjust the LNA 104 so as to shift the resonant frequency of the LNA 104 away from the frequency of the detected external jammer.

In another exemplary embodiment, the GPS receiver 102 comprises jammer detector (JD) 132. The JD 132 is operable to detect jammers in the GPS band. When a jammer is detected, (i.e., either a self jammer or external jammer) the JD 132 outputs a detection signal 134 to the LNA 104 to adjust the LNA 104 so as to shift the resonant frequency of the LNA 104 away from the frequency of the detected jammer.

In still another exemplary embodiment, the digital baseband processor 108 is operable to detect external jammers that may affect the performance of the GPS receiver 102. For example, the digital baseband processor 108 may determine that jammers may be present based on the current location of the device. For example, the current location of the device is determined from the received GPS signals and the digital baseband processor 108 operates to adjust the LNA 104 to suppress potential jammers in the current geographic region determined by the current position. If potential jammers exist based on the current geographic position, the digital baseband processor 108 outputs the control signal 130 to adjust the LNA 104 so as to shift the resonant frequency of the LNA 104 away from the frequency of the potential jammers.

Accordingly, information about existing jammers or the potential for jammers is determined using one or more of the following techniques.

1. Jammer information is determined from knowledge of current transmissions from the device and that are known by the baseband processor 108.
2. Jammer information is determined from knowledge of any external jammers that are detected by another receiver at the device and that are known by the baseband processor 108.
3. Jammer information is determined from the current location of the device which is known from processing received GPS signals.
4. Jammer information is determined from the presence of jammers in the GPS band detected by the jammer detector 132.

Thus, in various exemplary embodiments, the reconfigurable LNA 104 has an adjustable resonance frequency that can be adjusted based on the detection of self jamming or external jamming signals. For example, by shifting the resonance frequency of the LNA 104 to be farther away from the jamming frequency, additional jammer suppression is achieved. In the case where no jammers are detected, the resonant frequency of the LNA 104 can be restored for normal operation. It should be noted that the reconfigurable LNA 104 is not limited for use only in GNSS receivers as illustrated in FIG. 1, but is suitable for use with all types of front end receivers.

Figure 2:
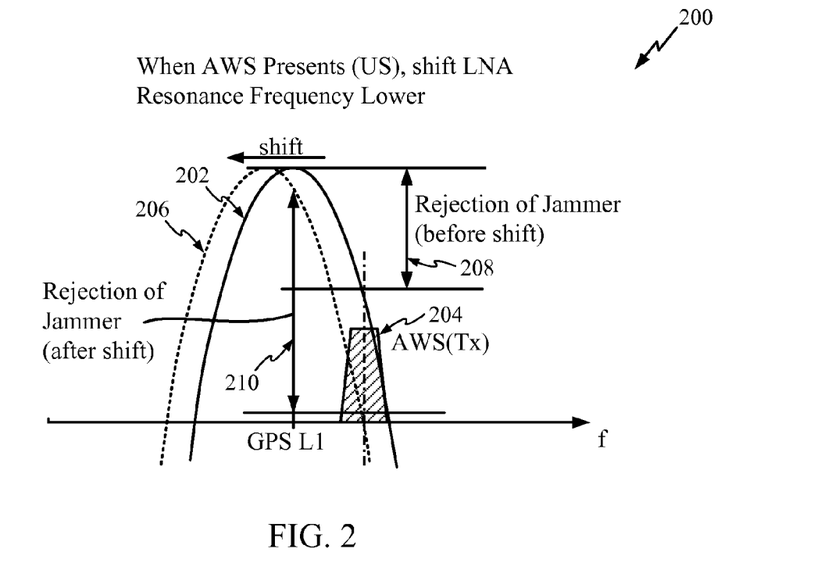
FIG. 2 shows an exemplary graph that illustrates the operation of exemplary embodiments of a reconfigurable LNA for increased jammer suppression.

FIG. 2 shows an exemplary graph 200 that illustrates the operation of exemplary embodiments of a reconfigurable LNA for increased jammer suppression. In the graph 200, frequency is represented along the horizontal axis and GPS L1 represents the frequency of received GPS signals during normal operation. The resonant frequency of the LNA 104 during normal operation is represented by the plot 202. A band of energy 204 represents a self jammer due to a communication transmission. For example, the communication transmission at the shown frequency may occur in the United States and is referred to AWS(Tx), or Band 4 in UMTS-FDD operation band. When the communication transmission is detected, either by the baseband processor 108 or the jammer detector 132, the LNA 104 is adjusted to move its resonant frequency to the left as shown by the plot line 206. As a result, increased jammer suppression is provided by the shifted resonant frequency characteristics of the LNA 104. For example, rejection of the jammer 204 before shifting the resonant frequency of the LNA 104 is illustrated at 208. The rejection of the jammer 204 after shifting the resonant frequency of the LNA 104 is illustrated at 210.

Figure 3:
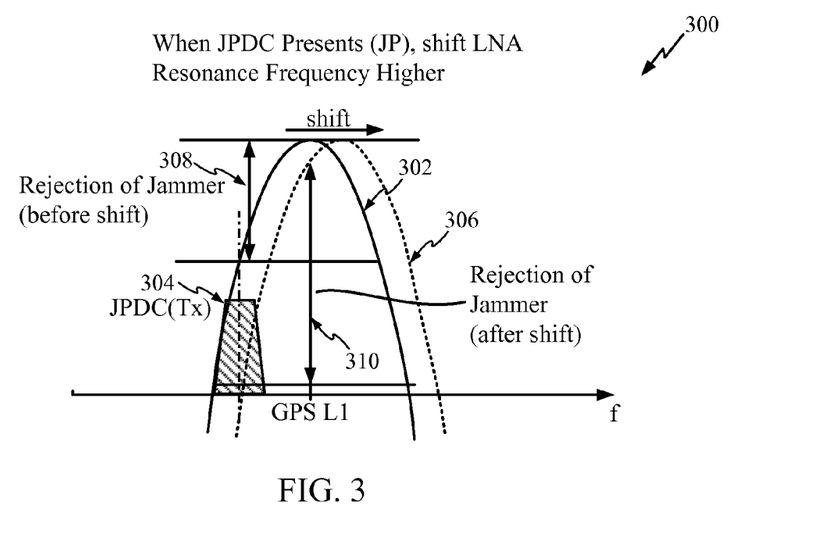
FIG. 3 shows an exemplary graph that illustrates the operation of exemplary embodiments of a reconfigurable LNA for increased jammer suppression.

FIG. 3 shows an exemplary graph 300 that illustrates the operation of exemplary embodiments of a reconfigurable LNA for increased jammer suppression. In the graph 300, frequency is represented along the horizontal axis and GPS L1 represents the frequency of GPS signals during normal operation. The resonant frequency of the LNA 104 during normal operation is represented by the plot 302. A band of energy 304 represents a self jammer due to a communication transmission. For example, the communication transmission at the shown frequency may occur in Japan and is referred to as JPDC(Tx), or Band 11 in UMTS-FDD operation band. When the communication transmission is detected, either by the baseband processor 108 or the jammer detector 132, the LNA 104 is adjusted to move its resonant frequency to the right as shown by the plot line 306. As a result, increased jammer suppression is provided by the shifted resonant frequency characteristics of the LNA 104. For example, rejection of the jammer before shifting the resonant frequency of the LNA 104 is illustrated at 308. The rejection of the jammer after shifting the resonant frequency of the LNA 104 is illustrated at 310.

Figure 4:
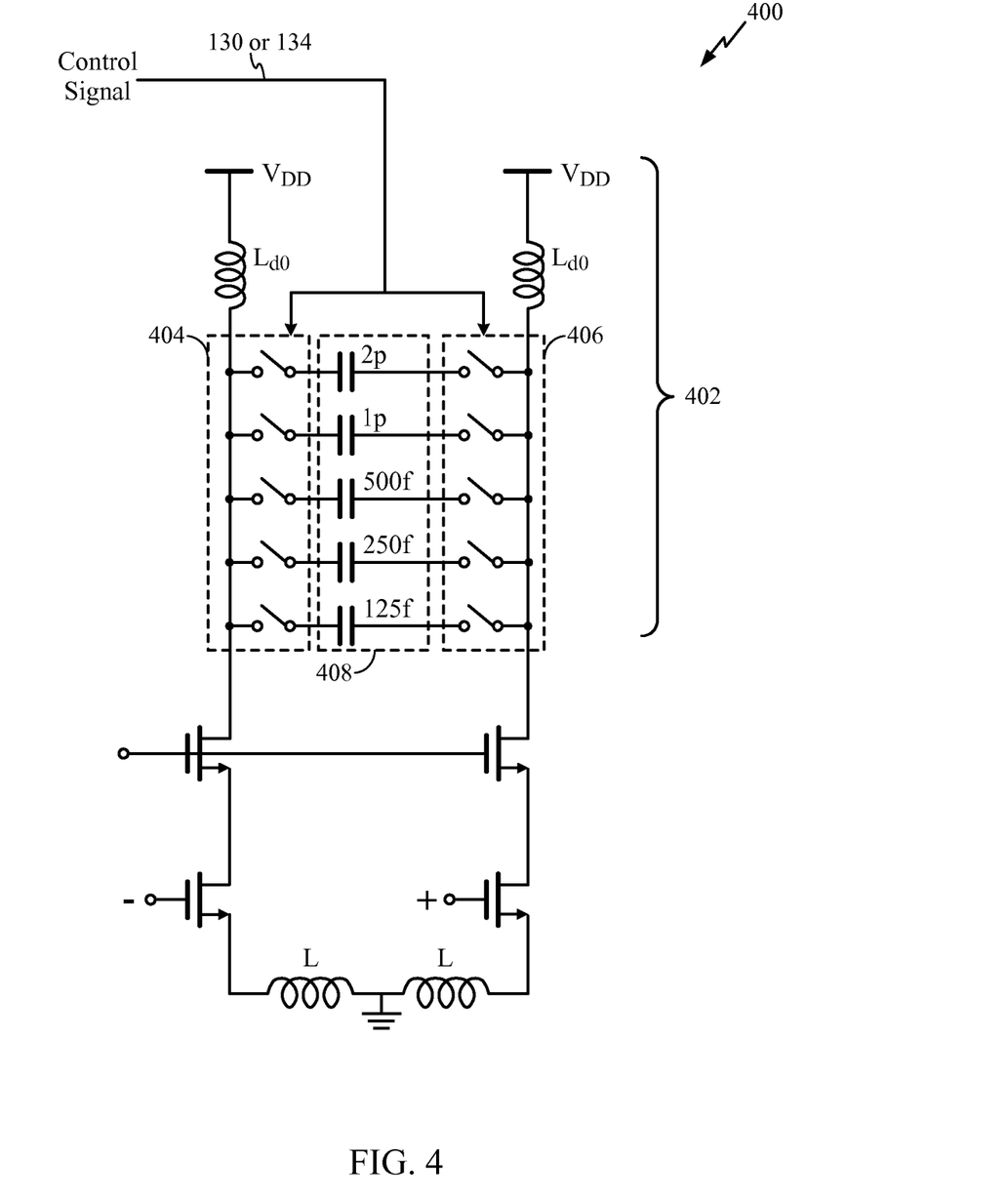
FIG. 4 illustrates an exemplary embodiment of an LNA with reconfigurable resonant frequency.

FIG. 4 illustrates an exemplary embodiment of an LNA 400 with reconfigurable resonant frequency. For example, the LNA 400 is suitable for use as the LNA 104 shown in FIG. 1. The LNA 400 comprises an LC tank circuit 402 operable to shift the resonant frequency of the LNA 400. The tank circuit 402 comprises NMOS switch banks 404, 406 and capacitor bank 408. During operation, the switch banks 404, 406 are used to control the capacitance value provided by the capacitor bank 408 to shift the resonant frequency away from any detected jammer. Thus, the resonant frequency can be shifted higher or lower depending on the settings of the NMOS switches 404, 406, which in one exemplary embodiment, are controlled by either the control signal 130 or 134. If no jammer is detected, the capacitor bank 406 is set to allow normal LNA operation at a designated resonant frequency.

Figure 5:
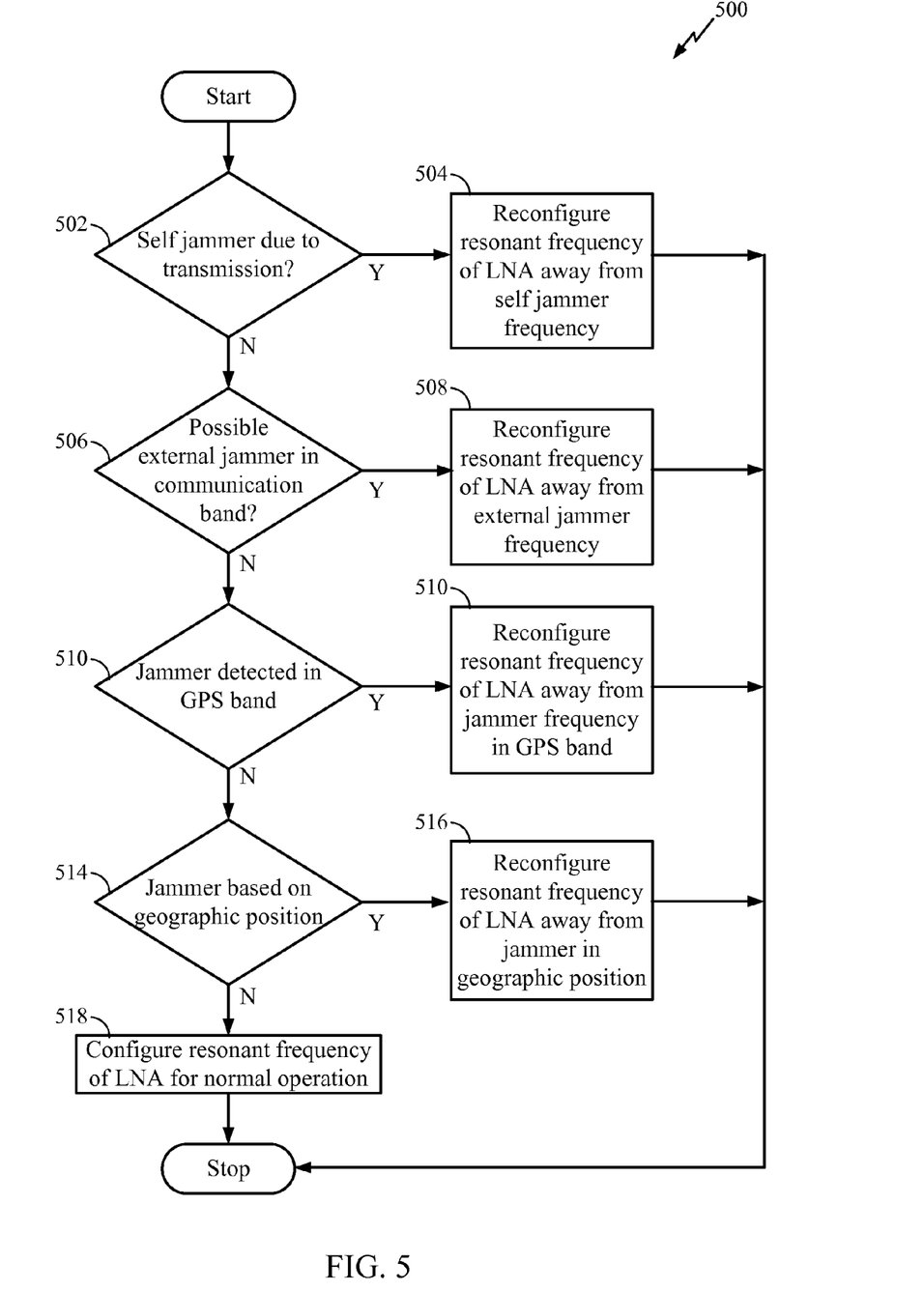
FIG. 5 illustrates an exemplary embodiment of a method for increased jammer suppression in a GPS receiver.

FIG. 5 illustrates an exemplary embodiment of a method 500 for increased jammer suppression in a front end receiver. For example, the method 500 is suitable for use with the GPS receiver 102 shown in FIG. 1 and reconfigurable LNA 400 shown in FIG. 4.

At block 502, a determination is made as to whether there are any self jammers present to due device transmissions. For example, in an exemplary embodiment, the baseband processor 108 has knowledge of current transmissions from the device that may operate as self jammers. If a self jammer is present, the method proceeds to block 504. If a self jammer is not present, the method proceeds to block 506.

At block 504, the LNA of the front end receiver is configured for increased jammer suppression. For example, the LC tank circuit 402 of the LNA 400 is adjusted by controlling the switch banks 404, 406 to selectively enable capacitors of the capacitor bank 408 to shift the LC resonant frequency (higher or lower) away from the frequency of the self jammer. In an exemplary embodiment, the baseband processor 108 outputs the control signal 130 to control the switch banks 404, 406 to shift the resonant frequency of the LNA.

At block 506, a determination is made as to whether there are any external jammers present to due transmissions in a communication band from nearby devices. For example, in an exemplary embodiment, the baseband processor 108 has knowledge of current external transmissions from nearby devices based on other local receivers at the device. If an external jammer is present, the method proceeds to block 508. If an external jammer is not present, the method proceeds to block 510.

At block 508, the LNA of the front end receiver is configured for increased jammer suppression. For example, the LC tank circuit 402 of the LNA 400 is adjusted by controlling the switch banks 404, 406 to selectively enable capacitors of the capacitor bank 408 to shift the LC resonant frequency (higher or lower) away from the frequency of the external jammer. In an exemplary embodiment, the baseband processor 108 outputs the control signal 130 to control the switch banks 404, 406 to shift the resonant frequency of the LNA.

At block 510, a determination is made as to whether there are any jammers present in a receive band, such as in a received GPS band. For example, in an exemplary embodiment, the jammer detector 132 detects for jammers in a received GPS band. If a received in-band jammer is present, the method proceeds to block 512. If a received in-band jammer is not present, the method proceeds to block 514.

At block 512, the LNA of the front end receiver is configured for increased jammer suppression. For example, the LC tank circuit 402 of the LNA 400 is adjusted by controlling the switch banks 404, 406 to selectively enable capacitors of the capacitor bank 408 to shift the LC resonant frequency (higher or lower) away from the frequency of the received in-band jammer. In an exemplary embodiment, the jammer detector 132 outputs the control signal 134 to control the switch banks 404, 406 to shift the resonant frequency of the LNA.

At block 514, a determination is made as to whether there are any external jammers present in the current geographic position of the device. For example, in an exemplary embodiment, the baseband processor 108 has knowledge of the current device position by processing received GPS signals. The baseband processor 108 also has knowledge of potential jammer signals in the current geographic region. For example, the baseband processor 108 may receive this knowledge from a base station or other entity. If a jammer is present in the current geographic region, the method proceeds to block 516. If a jammer is not present in the current geographic region, the method proceeds to block 518.

At block 516, the LNA of the front end receiver is configured for increased jammer suppression. For example, the LC tank circuit 402 of the LNA 400 is adjusted by controlling the switch banks 404, 406 to selectively enable capacitors of the capacitor bank 408 to shift the LC resonant frequency (higher or lower) away from the frequency of the jammer in the current geographic region. In an exemplary embodiment, the baseband processor 108 outputs the control signal 130 to control the switch banks 404, 406 to shift the resonant frequency of the LNA.

At block 518, the LNA of the front end receiver is reconfigured for normal operations at the appropriate resonant frequency. For example, the LC tank circuit 402 of the LNA 400 is adjusted to shift the LC resonant frequency back to the appropriate GPS resonant frequency (i.e., GPS L1 shown in FIG. 2)

Accordingly, a reconfigurable LNA for use in a front end receiver is provided. The LNA can be reconfigured to shift its resonant frequency away from detected self and/or external jammers thereby providing increased jammer suppression.

Figure 6:
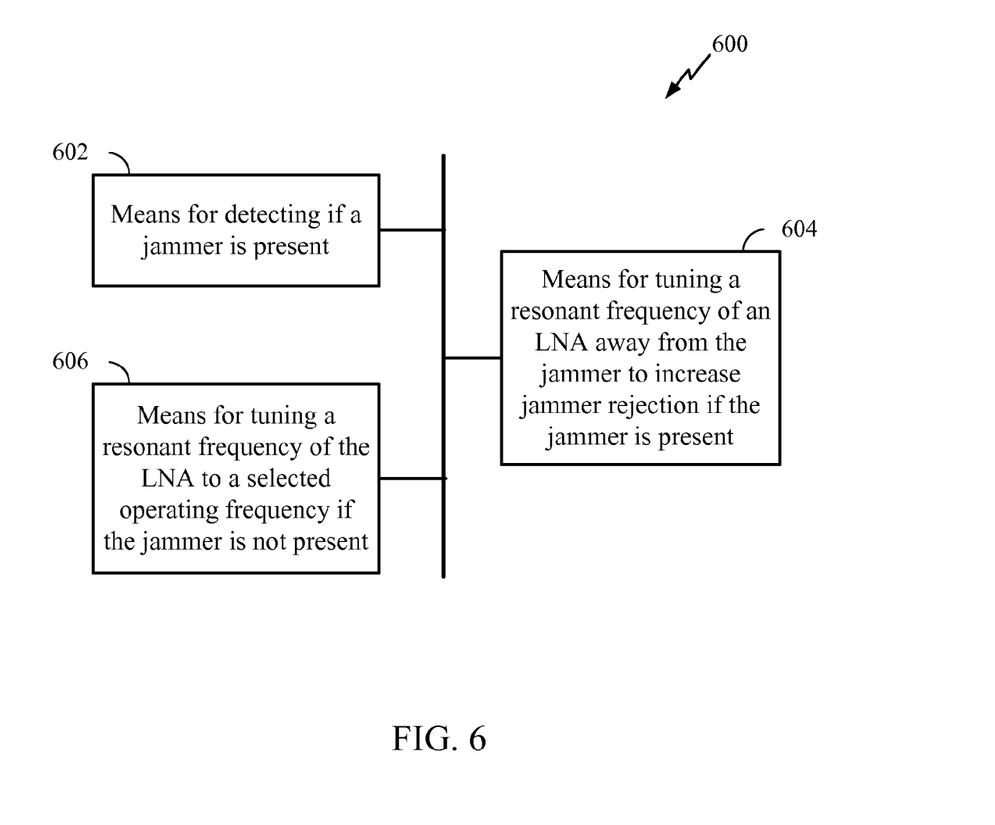
FIG. 6 shows an exemplary embodiment of a reconfigurable LNA apparatus.

FIG. 6 shows an exemplary embodiment of a reconfigurable LNA apparatus 600. For example, the apparatus 600 is suitable for use as the LNA 400 shown in FIG. 4. In an aspect, the apparatus 600 is implemented by one or more modules configured to provide the functions as described herein. For example, in an aspect, each module comprises hardware and/or hardware executing software.

The apparatus 600 comprises a first module comprising means (602) for detecting if a jammer is present, which in an aspect comprises the baseband processor 108 or the jammer detector 132.

The apparatus 600 also comprises a second module comprising means (604) for tuning a resonant frequency of an LNA away from the jammer to increase jammer rejection if the jammer is present, which in an aspect comprises the switch banks 404 and 406 and capacitor bank 408.

The apparatus 600 also comprises a third module comprising means (606) for tuning the resonant frequency of the LNA to a selected operating frequency if the jammer is not present, which in an aspect comprises the switch banks 404 and 406 and capacitor bank 408.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   an LNA having a tunable resonant frequency; and
   a detector configured to output a control signal that is connected to the LNA and configured to tune the resonant frequency of the LNA to increase jammer suppression.

2. The apparatus of claim 1, the LNA comprising:
   an LC tank circuit comprising a capacitor bank; and
   at least one switch coupled to the capacitor bank to selectively enable at least one capacitor of the capacitor bank into the LC tank circuit based on the control signal to tune the resonant frequency of the LNA.

3. The apparatus of claim 1, the detector comprising a jammer detector configured to detect a jammer frequency received in a receiver front end and output the control signal to tune the resonant frequency of the LNA away from the jammer frequency.

4. The apparatus of claim 1, the detector comprising a processor configured to detect a transmitted self-jamming frequency and output the control signal to tune the resonant frequency of the LNA away from the self-jamming frequency.

5. The apparatus of claim 1, the detector comprising a processor configured to detect a jammer frequency received in a communication band and output the control signal to tune the resonant frequency of the LNA away from the jammer frequency.

6. The apparatus of claim 1, the detector comprising a processor configured to detect a jammer frequency in a geographic location and output the control signal to tune the resonant frequency of the LNA away from the jammer frequency.

7. The apparatus of claim 1, the detector configured to tune the resonant frequency of the LNA to a selected operating frequency when no jammers are detected.

8. The apparatus of claim 1, the apparatus configured for use in a transceiver front end.

9. The apparatus of claim 1, the apparatus configured for use in a Global Navigation Satellite Systems (GNSS) receiver.

10. A method comprising:
    detecting if a jammer is present at an LNA having a tunable resonant frequency and outputting a control signal that is connected to the LNA;
    tuning a resonant frequency of the LNA away from the jammer in response to the control signal to increase jammer rejection if the jammer is present; and
    tuning the resonant frequency of the LNA to a selected operating frequency in response to the control signal if the jammer is not present.

11. The method of claim 10, further comprising tuning the resonant frequency of the LNA using an LC tank circuit comprising a capacitor bank and at least one switch coupled to the capacitor bank to selectively enable at least one capacitor of the capacitor bank into the LC tank circuit based on a control signal.

12. The method of claim 10, the detecting comprising:
    detecting a jammer frequency received by a receiver front end; and
    outputting control signal to tune the resonant frequency of the LNA away from the jammer frequency.

13. The method of claim 10, the detecting comprising:
    detecting a transmitted self-jamming frequency; and
    outputting the control signal to tune the resonant frequency of the LNA away from the self-jamming frequency.

14. The method of claim 10, the detecting comprising:
    detecting a jammer frequency received in a selected communication band; and
    outputting the control signal to tune the resonant frequency of the LNA away from the jammer frequency.

15. The method of claim 10, the detecting comprising:
    detecting a jammer frequency in a geographic location; and
    outputting the control signal to tune the resonant frequency of the LNA away from the jammer frequency.

16. An apparatus comprising:
    means for detecting if a jammer is present at an LNA having a tunable resonant frequency;
    means for outputting a control signal that is connected to the LNA;

means for tuning a resonant frequency of the LNA away from the jammer in response to the control signal to increase jammer rejection if the jammer is present; and means for tuning the resonant frequency of the LNA to a selected operating frequency in response to the control signal if the jammer is not present.

17. The apparatus of claim 16, further comprising:

means for detecting a selected jammer frequency; and means for outputting the control signal to tune the resonant frequency of the LNA away from the jammer frequency.

18. The apparatus of claim 16, further comprising:

means for detecting a transmitted self-jamming frequency; and means for outputting the control signal to tune the resonant frequency of the LNA away from the self-jamming frequency.

19. The apparatus of claim 16, further comprising:

means for detecting a jammer frequency received in a selected communication band; and means for outputting the control signal to tune the resonant frequency of the LNA away from the jammer frequency.

20. The apparatus of claim 16, further comprising:

means for detecting a jammer frequency in a geographic location; and means for outputting the control signal to tune the resonant frequency of the LNA away from the jammer frequency.

\* \* \* \* \*